(12) United States Patent
Yang et al.

(10) Patent No.: US 7,955,895 B2
(45) Date of Patent: Jun. 7, 2011

(54) STRUCTURE AND METHOD FOR STACKED WAFER FABRICATION

(75) Inventors: Ku-Feng Yang, Taichung (TW);
Wen-Chih Chiou, Miaoli (TW);
Weng-Jin Wu, Hsinchu (TW);
Hung-Jung Tu, Hualien (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 12/267,244

(22) Filed: Nov. 7, 2008

(65) Prior Publication Data
US 2010/0117226 A1 May 13, 2010

(51) Int. Cl.
*H01L 21/00* (2006.01)
(52) U.S. Cl. . 438/108; 438/459; 438/462; 257/E21.503; 257/E21.511
(58) Field of Classification Search .................. 438/108, 438/459, 462; 257/E21.503, E21.511
See application file for complete search history.

(56) References Cited

U.S. PATENT DOCUMENTS

| 6,599,778 B2 * | 7/2003 | Pogge et al. .................. 438/118 |
| 7,709,295 B2 | 5/2010 | Fujimura |
| 2007/0184660 A1 * | 8/2007 | Fujimura ...................... 438/691 |

FOREIGN PATENT DOCUMENTS

| CN | 1592965 A | 3/2005 |
| CN | 101022081 A | 8/2007 |

* cited by examiner

*Primary Examiner* — Jarrett J Stark
(74) *Attorney, Agent, or Firm* — Birch, Stewart, Kolasch & Birch, LLP

(57) ABSTRACT

A method for fabricating stacked wafers is provided. In one embodiment, the method comprises providing a wafer having a chip side and a non-chip side, the chip side comprising a plurality of semiconductor chips. A plurality of dies is provided, each of the die bonded to one of the plurality of semiconductor chips. The chip side of the wafer and the plurality of dies are encapsulated with a protecting material. The non-chip side of the wafer is thinned to an intended thickness. The wafer is then diced to separate the wafer into individual semiconductor packages.

10 Claims, 5 Drawing Sheets

STRUCTURE AND METHOD FOR STACKED WAFER FABRICATION

BACKGROUND

The present invention relates generally to the fabrication of semiconductor devices, and more particularly, to a structure and method for stacked wafer fabrication.

In the semiconductor industry, efforts to reduce the thickness of a semiconductor wafer are in progress to respond to the goals of reducing the thickness of semiconductor packages, increase the chip speed, and for high-density fabrication. In stacked wafer fabrication, two or more semiconductor wafers having integrated circuits formed therein are joined together. Thickness reduction is performed by so-called backside grinding of a semiconductor wafer on the surface opposite that containing pattern-formed circuitry. Because the thinned wafer tends to have insufficient strength and is more susceptible to deformation such as bending and/or warping, an encapsulating step is typically performed in which a surface of the wafer is encapsulated in a molding compound (e.g., thermocuring epoxy resin), prior to the wafer being separated into individual chip packages using a dicing process. These individual chip packages are then mounted onto a substrate, such as a printed circuit board (PCB).

Conventional stacked wafer processes, however are not without their drawbacks. At times, where the molding compound becomes undone or delaminated from the wafer to which it is attached to, the wafer may be subject to warpage. Wafer warpage is detrimental to the fabrication process and tend to decrease the overall process yield and may degrade the quality and reliability of the chip packages that are produced. Moreover, where molding delamination from the wafer has occurred, the edges of chips of the wafer may be more susceptible to cracking, chipping, and/or corrosive environmental influences during the subsequent dicing process and associated handling.

For these reasons and other reasons that will become apparent upon reading the following detailed description, there is a need for an improved method of stacked wafer fabrication that avoids the shortcomings of the conventional wafer bonding processes.

SUMMARY

The present disclosure is directed to a method for fabricating stacked wafers. In one embodiment, the method comprises providing a wafer having a chip side and a non-chip side, the chip side comprising a plurality of semiconductor chips. A plurality of dies is provided, each of the die bonded to one of the plurality of semiconductor chips. The chip side of the wafer and the plurality of dies are encapsulated with a protecting material. The non-chip side of the wafer is thinned to an intended thickness. The wafer is then diced to separate the wafer into individual semiconductor packages.

BRIEF DESCRIPTION OF THE DRAWINGS

The features, aspects, and advantages of the present invention will become more fully apparent from the following detailed description, appended claims, and accompanying drawings in which:

DETAILED DESCRIPTION

In the following description, numerous specific details are set forth to provide a thorough understanding of the present invention. However, one having an ordinary skill in the art will recognize that the invention can be practiced without these specific details. In some instances, well-known structures and processes have not been described in detail to avoid unnecessarily obscuring the present invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Figure 1:
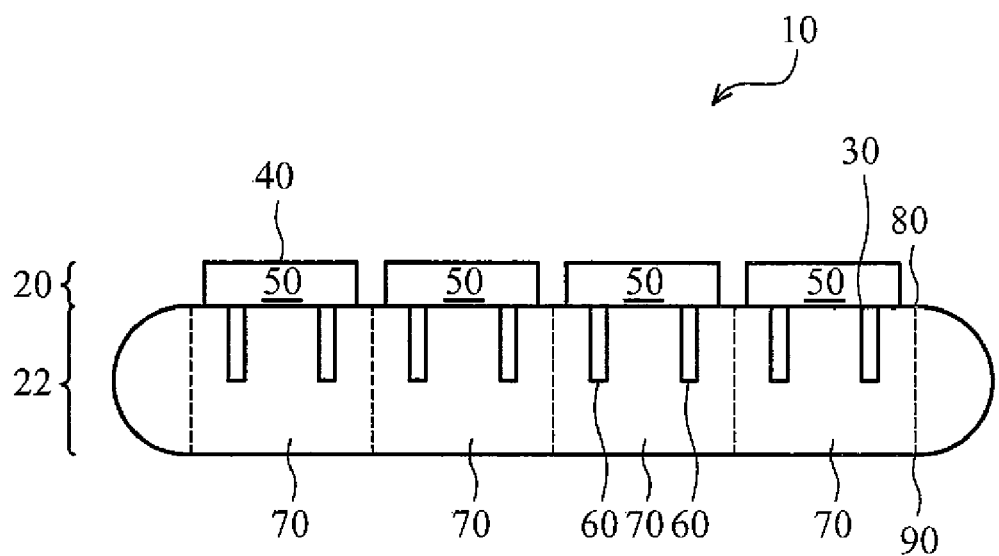
FIGS. 1-6 are cross-sectional views of one embodiment of an integrated circuit structure during various fabrication stages thereof.

FIG. 1 is a cross-sectional view of one embodiment of an integrated circuit structure 10 during a fabrication stage thereof. Dies 20 are bonded onto wafer 22. Dies 20 may include memory chips, RF (radio frequency) chips, logic chips, or other chips. Dies 20 each has a front surface 30 and a back surface 40. Each of the dies 20 includes semiconductor substrate 50, wherein the back surfaces 40 of dies 20 are also the back surfaces of the respective semiconductor substrates 50.

Figure 7:
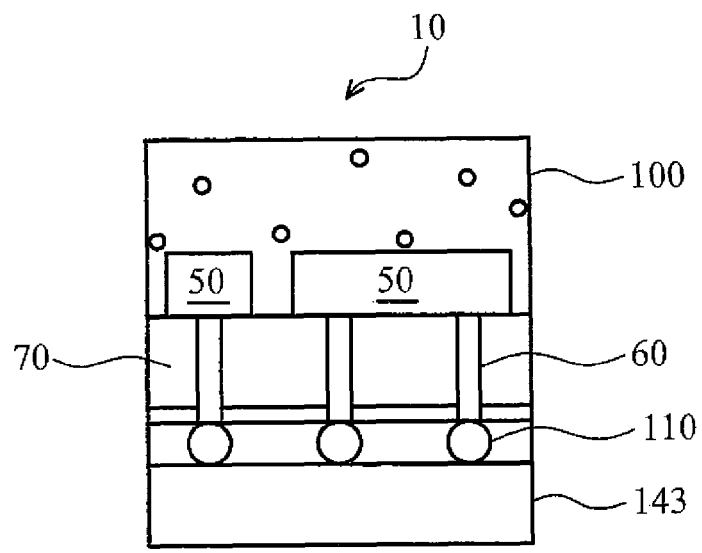
FIG. 7 is a cross-sectional view of an integrated circuit structure according to one embodiment of the present invention.
Figure 8:
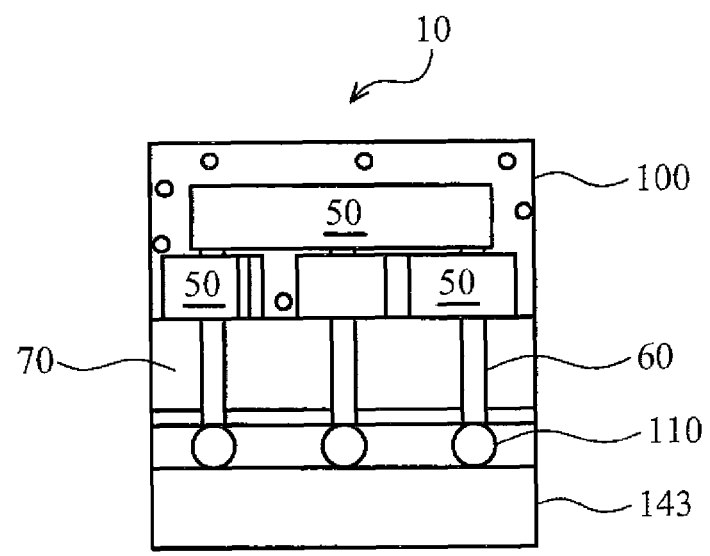
FIG. 8 is a cross-sectional view of an integrated circuit structure according to a second embodiment of the present invention.

Wafer 22 includes a plurality of semiconductor chips 70. Wafer 22 includes semiconductor wafers such as silicon, gallium arsenide, a rock crystal wafer, sapphire, glass, and the like. Chips 70 may include memory chips, RF (radio frequency) chips, logic chips, or other chips. In an embodiment, each die 20 is bonded onto one semiconductor chip 70. Alternatively, one semiconductor chip 70 may have more than one die 20 bonded thereon. In one embodiment as shown in FIG. 7, after singulation, integrated circuit 10 has two dies bonded to the semiconductor chip 70. In another embodiment as shown in FIG. 8, after singulation, integrated circuit 10 has three dies bonded to the semiconductor chip 70. The dies 20 bonded onto a same semiconductor chip 70 may have the same, or different, circuit design, and/or sizes.

Wafer 22 has a front surface 80 and a back surface 90, wherein bond pads (not shown) and/or other interconnect structures (not shown) are close to the front surface 80, while the back surface 90 is the back surface of a semiconductor substrate. Integrated circuits (not shown) including active and passive devices such as transistors, resistors, capacitors, and the like, are formed at the front surface of wafer 22.

Preferably, dies 20 and chips 70 are bonded face-to-face, wherein the bonding methods include commonly used methods such as oxide-to-oxide bonding, oxide-to-silicon bonding, copper-to-copper bonding, adhesive bonding, and the like. In an embodiment, semiconductor chip 70 includes one or more through-silicon via (TSV) 60 that extend from the front surface 80 down into wafer 22, wherein the TSV 60 are connected to the dies 20. In an alternative embodiment, instead of being pre-formed in semiconductor chips 70, TSVs 60 may be formed after a subsequent step of thinning wafer 22.

Figure 2:
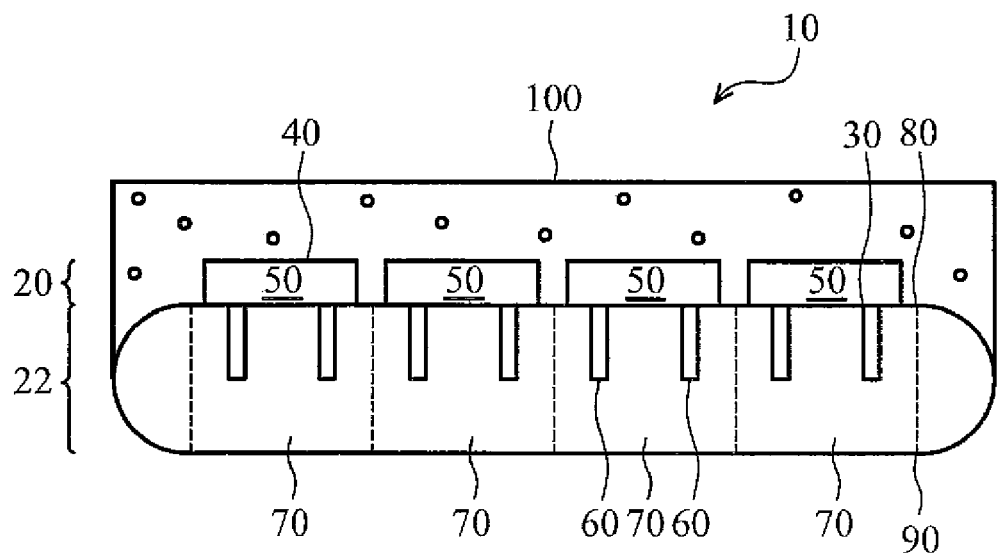

With reference now to FIG. 2, a molding compound or protecting material 100 is coated over the front surface 80 of wafer 22 and over the plurality of dies 20. Protecting material 100 is formed of a curable material such as, for example a polymer-based material, resin-based material, polyimide, silicon oxide, epoxy, benzocyclobutenes (BCB), Silk™ (Dow Chemical), or a combination thereof. In order to prevent wafer 22 or a body to be ground from warping during grinding, the protecting material 100 preferably has a sufficiently high stiffness and flexural rigidity following curing of the protecting material 100. Protecting material 100 may be formed on wafer 22 to a thickness greater than the height of die 20 so as to encapsulate die 20. The thickness of protecting material 100 is not particularly limited so long as it can ensure the thickness uniformity required for the grinding of wafer 22 or a body to be ground. However, to obtain the desired thickness uniformity after grinding of the substrate, the thickness of protecting material 100 is preferably uniform.

Protecting material 100 may be applied to integrated circuit structure 10 using processes such as, for example injection molding, compression molding, stencil printing, spin-on coating, or future-developed molding processes. After the coating of protecting material 100 and prior to a thinning process, a curing or baking step is performed to solidify protecting material 100. In one embodiment of the present disclosure, the protecting material 100 is baked in a heating chamber at a temperature of from about 130° C. to about 200° C. for a time of from about 10 seconds to about 300 seconds.

After the protecting material 100 is cured, the non-chip side of wafer 22 undergoes a thinning process. The non-chip side of wafer 22 is mechanically ground by a grinder to reduce the thickness thereof. With the mechanical grinding, wafer 22 can be ground to a thickness of about 50-100 μm, depending on the conditions. However, further reduction in the thickness of wafer 22 by mechanical grinding may result in damage to the wafer. Therefore, to further reduce the thickness of wafer 22, it is preferable to use a method less likely to cause damage during a process, such as wet chemical etching or chemical mechanical polishing (CMP). The thickness of wafer 22 can be set depending on the purpose for which the semiconductor package is used. In one embodiment, the wafer 22 is thinned to a thickness of from about 5 μm to about 50 μm. In another embodiment, the wafer 22 is thinned to a thickness of from about 50 μm to about 180 μm. After the wafer 22 is thinned to a predetermined thickness, the TSV 60 in the semiconductor chip 70, if pre-formed, has a first end connected to a die 20 and a second end exposed and leveled with the thinned non-chip side of the wafer 22.

Figure 3:
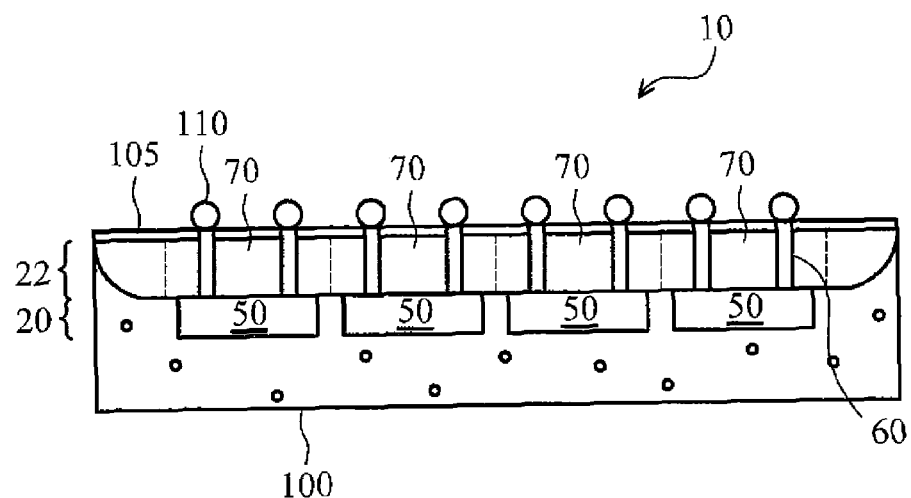

FIG. 3 illustrates a cross sectional view of the integrated circuit after a thinning process, and the formation of a planar dielectric layer 105 over the thinned side of wafer 22 and solder bumps 110 for connection to the exposed ends of the TSVs 60. If necessary, an etch stop layer (not shown) may be formed between dielectric layer 105 and semiconductor chips 70. Metal lines/pads (not shown) are formed in dielectric layer 105, and are electrically connected to TSVs 60. Dielectric layer 105 and metal lines/pads may be formed using commonly used methods such as single damascene processes. Alternatively, metal lines may be formed by blanket depositing a metal film, patterning the metal film, and filling dielectric layer 105 into the spacing between metal lines. Metal lines may be formed of copper, aluminum, tungsten, silver, and combinations thereof. Dielectric layer 105 may be formed of oxides, nitrides, un-doped silicate glass, fluorinated silicate glass, low-k dielectric materials, and the like. Conductive structures such as solder bumps 110 are then formed to connect to the exposed ends of the TSVs 60.

Figure 4:
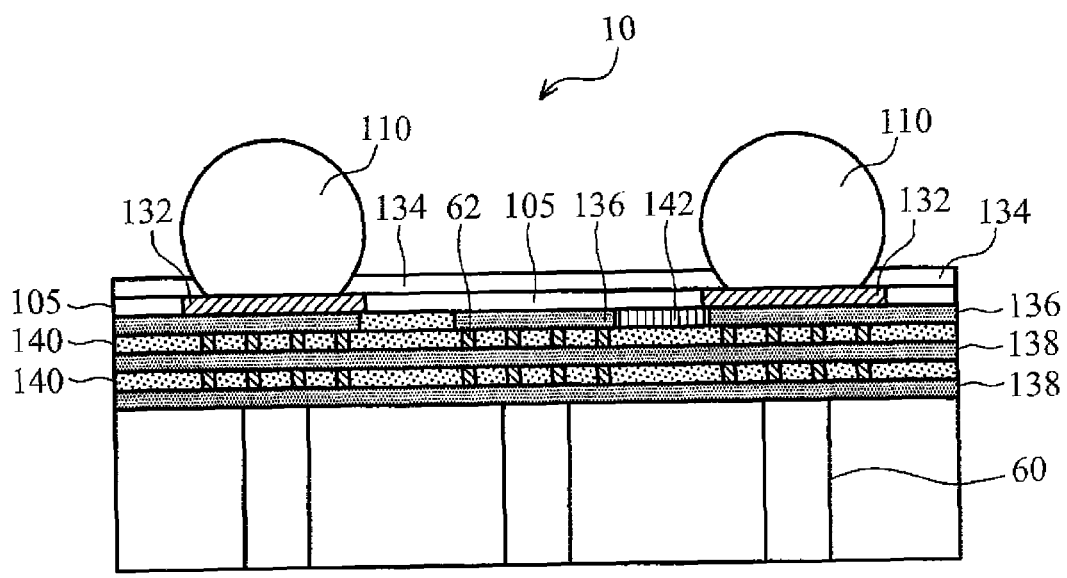

FIG. 4 is a close-up cross-sectional view of a portion of the integrated circuit structure of FIG. 3 according to one embodiment of the present invention. Solder bumps 110 are soldered to an upper surface of bump pads 132 and partially covered by a passivation layer 134. The bump pads 132 are surrounded by dielectric layer 105. The bump pads 132 are provided in electrical contact with an upper conductive layer 136, which is separated from an underlying conductive layer 138 by an insulative layer 140. The underlying conductive layer 138 is in electrical contact with TSVs 60. The conductive layers 136, 138 are disposed in electrical contact with each other through conductive vias 62 that extend through the insulative layers 140. As further shown in FIG. 4, each bump pad 132 may be used either in conjunction with an RDL (re-distribution layer) 142 which contacts a conductive layer 136 disposed in electrical contact with underlying conductive layers 138 through conductive vias 62, as shown on the right-hand side of FIG. 4; or without the RDL 142, as shown on the left-hand side of FIG. 4.

Figure 5:
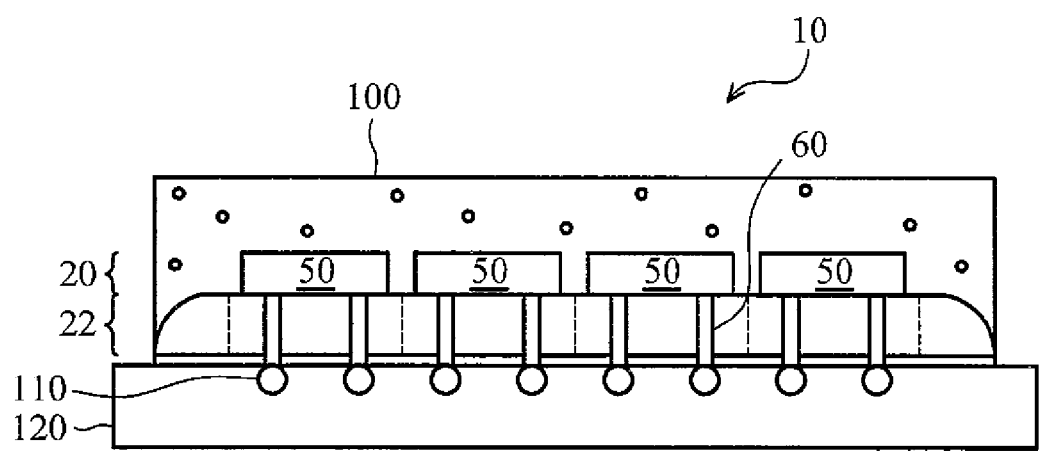
Figure 6:
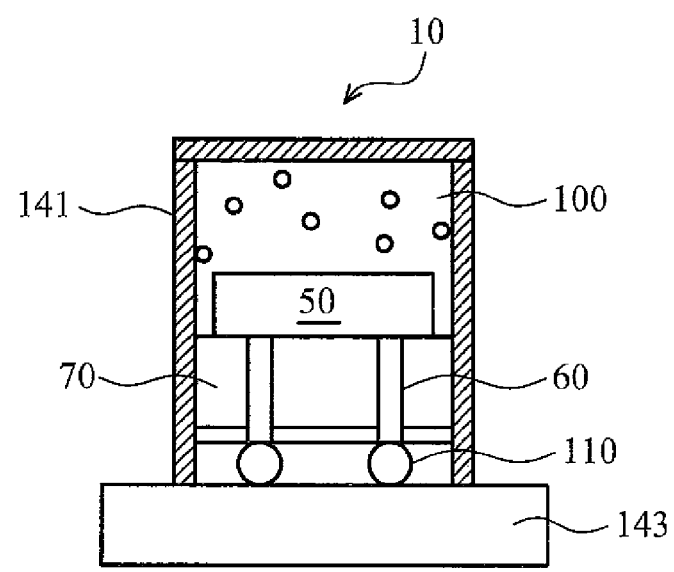

As illustrated in FIG. 5, typically after wafer-level testing has been completed, wafer 22 is then affixed to a dicing tape 120 or a die frame where it is then diced in the usual manner along cutting lines to separate the encapsulated wafer into individual semiconductor packages. FIG. 6 shows a semiconductor package enclosed in a final molding compound or protection material 141 to protect the package from environmental influences. Solder bumps 110 of the individual semiconductor packages are then bonded to electrical terminals in a substrate 143 such as a printed circuit board (PCB).

Figure 9:
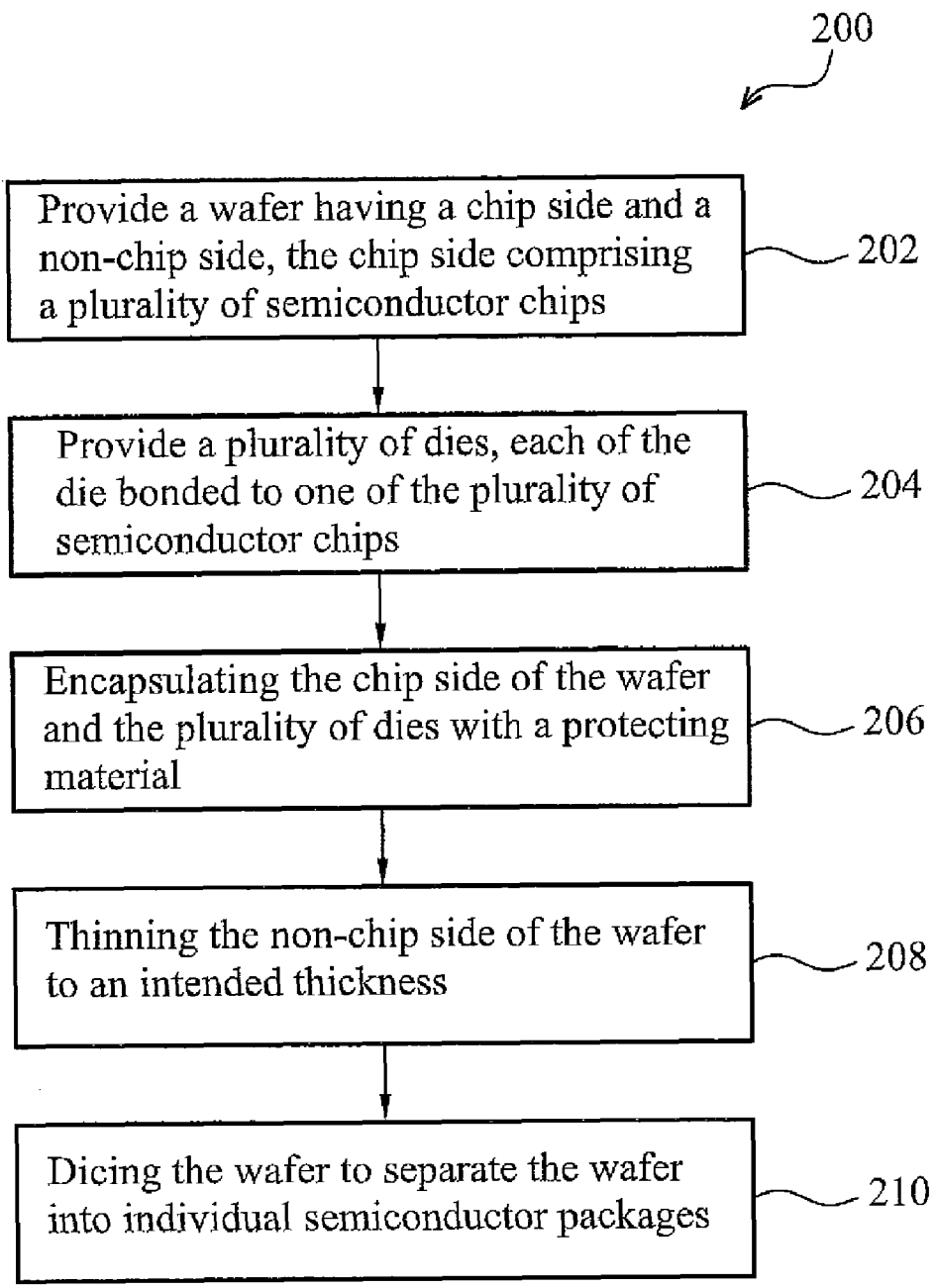
FIG. 9 is a flowchart showing one embodiment of a method for forming an integrated circuit structure.

FIG. 9 is a flowchart showing an embodiment of a method 200 of forming an integrated circuit structure, which is the method described above in association with FIGS. 1-6. The method 200 begins at step 202 by providing a wafer having a chip side and a non-chip side, the chip side comprising a plurality of semiconductor chips. At step 204, a plurality of dies are provided, each of the die bonded to one of the plurality of semiconductor chips. At step 206, the chip side of the wafer and the plurality of dies are encapsulated with a protecting material. At step 208, the non-chip side of the wafer is thinned to an intended thickness. At step 210, the wafer is diced to separate the wafer into individual semiconductor packages for mounting onto a substrate (e.g., PCB).

In the preceding detailed description, the present invention is described with reference to specifically exemplary embodiments thereof. It will, however, be evident that various modifications, structures, processes, and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A method of forming an integrated circuit structure, comprising:
   providing a wafer having a chip side and a non-chip side, the chip side comprising a plurality of semiconductor chips;
   providing a plurality of dies, each of the die bonded to one of the plurality of semiconductor chips;
   encapsulating the chip side of the wafer and the plurality of dies with a protecting material;

thinning the non-chip side of the wafer to an intended thickness; and dicing the wafer to separate the wafer into individual semiconductor packages, each of the plurality of the semiconductor chips comprises a through-silicon-via (TSV), the TSV having a first end connected to one of the plurality of dies and a second end exposed and leveled with the thinned non-chip side of the wafer.

2. The method of claim 1, wherein the protecting material is a polymer-based material, resin-based material, polyimide, silicon oxide, epoxy, benzocyclobutenes (BCB), Silk™ (Dow Chemical), or combinations thereof.

3. The method of claim 1, wherein the step of encapsulating is performed using at least one method selected from the group consisting of injection molding, compression molding, stencil printing, and spin-on coating.

4. The method of claim 1, further comprising, before the step of performing the thinning, baking the protecting material to solidify the protecting material.

5. The method of claim 1, wherein thinning the wafer comprises mechanically thinning the wafer and then using wet chemical etching or chemical mechanical polish (CMP).

6. The method of claim 1, wherein the wafer is thinned to a thickness of from about 5 µm to about 50 µm.

7. The method of claim 1, wherein the wafer is thinned to a thickness of from about 50 µm to about 180 µm.

8. The method of claim 1, further comprising, after thinning the wafer, forming a planar insulating layer over the thinned side of the wafer.

9. The method of claim 1, further comprising, before dicing the wafer, providing solder bumps to connect to the exposed end of the TSV.

10. The method of claim 1, wherein a die frame is affixed to the semiconductor wafer before dicing the wafer.

* * * * *